United States Patent [19]

Aita

[11] Patent Number: 5,405,734
[45] Date of Patent: Apr. 11, 1995

[54] METHOD FOR CORRECTING A PATTERNED FILM USING AN ION BEAM

[75] Inventor: Kazuo Aita, Tokyo, Japan

[73] Assignee: Seiko Instruments Inc., Tokyo, Japan

[21] Appl. No.: 36,449

[22] Filed: Mar. 24, 1993

[30] Foreign Application Priority Data

Mar. 31, 1992 [JP] Japan .................................. 4-078027

[51] Int. Cl.⁶ .............................................. G03F 7/00
[52] U.S. Cl. ........................................ 430/323; 430/5; 430/328; 430/329
[58] Field of Search .................. 430/5, 318, 323, 327, 430/328, 329; 250/492.1, 492.3; 156/643, 659.1

[56] References Cited

U.S. PATENT DOCUMENTS

| | | | |
|---|---|---|---|
| 3,748,975 | 7/1973 | Tarabocchia | 430/5 |
| 4,931,307 | 6/1990 | Sugita | 427/38 |
| 5,198,377 | 3/1993 | Kato | 437/40 |

Primary Examiner—Kathleen Duda
Attorney, Agent, or Firm—Spensley Horn Jubas & Lubitz

[57] ABSTRACT

Patterned film portions are removed from a surface of a flat substrate by irradiation with a focused ion beam without created undesired scars or processing grooves in the substrate surface. This is achieved by applying a masking substance only onto the substrate surface where it is not covered by the patterned film portions, and then using the focused ion beam to etch away the patterned film portions.

4 Claims, 1 Drawing Sheet

FIG. 1(a)     FIG. 1(b)     FIG. 1(c)
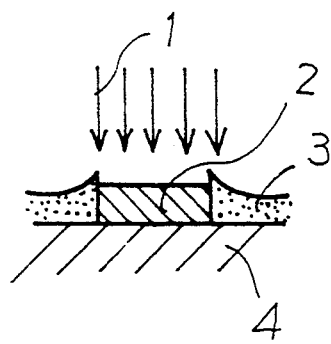 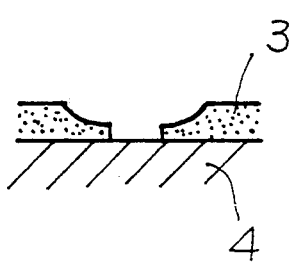 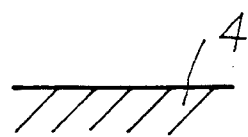
FIG. 2(a)     FIG. 2(b)
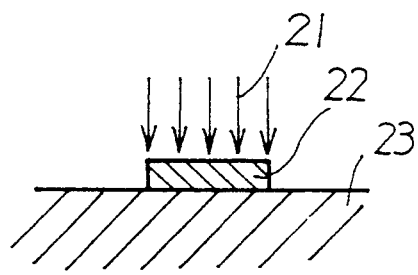 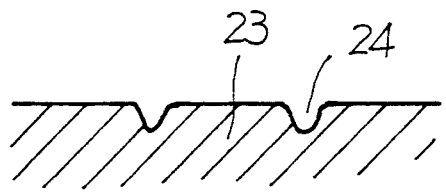
FIG. 3(a)     FIG. 3(b)     FIG. 3(c)
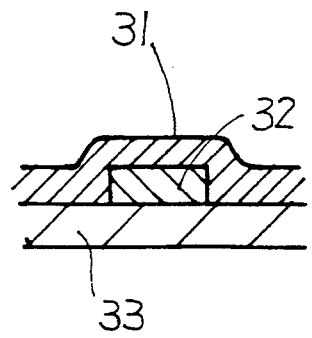 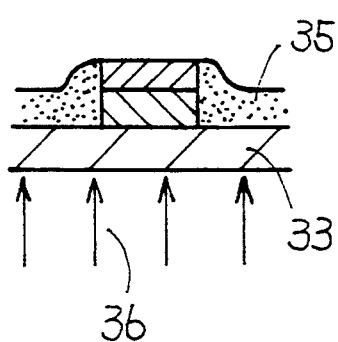 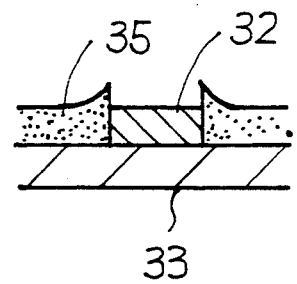

METHOD FOR CORRECTING A PATTERNED FILM USING AN ION BEAM

BACKGROUND OF THE INVENTION

The invention relates to a method for correcting a patterned film by focused ion beam etching of a sample such as a photomask, a reticle, an X-ray mask, or the like, in a semiconductor manufacturing process.

In the prior art as shown in FIG. 2(a), when removing an excess portion 2 of a patterned film from a substrate 4 by focused ion beam etching with a scanning focused ion beam 1, imaging of the patterned film at the periphery of the excess portion 2 on substrate 4 is performed by detecting secondary charged particles which are generated from the pattern or the substrate 4 by irradiation with the scanning focused ion beam 1. And then, only the excess portion 2 of the pattern film is repeatedly irradiated with the scanning focused ion beam 1 for removal of the excess portion, while monitoring secondary charged particles emitted from the excess portion 2 or from the substrate 4 adjacent the excess portion 2. By monitoring the secondary charged particles at each irradiation point, each end point of the removal process by the irradiation with the scanning focused ion beam can be detected.

In the conventional method as described the above, when the excess patterned film 2 is removed by irradiation with the focused ion beam 1, the amount of material removed is greater at the edges of the excess portion 2 than at the interior of the excess portion due to the edge effect. Further, the focused ion beam scatters at a small angle at the edges of the excess film portion 2, impinges on the substrate 4 at the periphery of the excess portion 2 and etches the substrate 4 at or adjacent the periphery of the excess portion 2. This constitutes unnecessary or harmful processing which creates a groove 5 at the periphery of the excess film portion 2, as shown in FIG. 2(b). When the sample is a photomask or a reticle to be used for the production of semiconductor device, there is a problem that this groove 5 scatters or refracts light which is recognized as a new defect of the sample.

SUMMARY OF THE INVENTION

Accordingly, it is an object of the present invention to prevent such unnecessary etching of a substrate.

The above and other objects are achieved, according to the present invention, by a method for removing a patterned film from a substrate surface by irradiation of the patterned film with a scanning focused ion beam, which method includes, in the order recited, the steps of:

forming a mask on the substrate surface only at locations of the substrate surface which are not covered with the patterned film;

irradiating the patterned film with the scanning focused ion beam for removing the patterned film from the substrate surface; and removing the mask from the substrate surface by means of a solvent.

According to the above-mentioned method, during the processing of the edges of excess patterned film portions, the ion beam does not irradiate the substrate adjacent the edges of the excess patterned film portions. Therefore, unnecessary or harmful etching of the substrate is prevented adjacent the edges of the excess patterned film portions.

Other and further objects, features and advantages of the invention will appear more fully from following description.

BRIEF DESCRIPTION OF DRAWINGS

FIGS. 1(a), 1(b) and 1(c) are simplified pictorial cross-sectional views illustrating successive stages in an embodiment of the processing method in accordance with the present invention.

FIGS. 2(a) and 2(b) are views similar to those of FIGS. 1 illustrating the conventional method.

FIGS. 3(a), 3(b) and 3(c) are views similar to those of FIGS. 1 and 2 illustrating successive stages in a procedure for forming the mask shown in FIG. 1(a), which mask does not cover the patterned film portions to be removed.

DESCRIPTION OF THE PREFERRED EMBODIMENTS

An embodiment of the invention will be described with reference to the drawings.

In FIG. 3(a), a negative type photoresist 31 has been applied onto the surface of a sample 4 from which a patterned film 2 is to be removed. Sample 4 is a transparent substrate plate having opposed upper and lower major surfaces, with patterned film 2 formed on the upper major surface, which is typically planar. The patterned film 2 illustrated in the figures is an excess film portion.

Then, negative type photoresist 31 is exposed by irradiating a light 36 from the lower major surface side of substrate 4, opposite to the upper major surface side carrying patterned film portion 2, as shown in FIG. 3(b). Only the negative type resist on substrate 4 which does not cover patterned film portion 2 is exposed, to constitute exposed negative type resist 35, while the resist covering portion 2 is unexposed negative type resist 34.

Unexposed negative type resist 34 present on patterned film portion 2 is developed leaving the portions of substrate 4 which are not covered by patterned film portion 2 covered by the exposed negative type resist 35 as shown in FIG. 3(c).

In this state, as shown in FIG. 1(a), a scanning focused ion beam 1 will irradiate the entirety of the excess patterned film portion 2, in order to remove the excess patterned film portion 2, without irradiating any part of substrate 4. By irradiation with the scanning focused ion beam 1, the excess patterned film portion 2 is removed. The excess patterned film portion 2 is removed by sputter etching with the ion beam 1.

Since the substrate 4 is masked with the negative type resist 35 immediately adjacent, and contacting, the edges of the excess patterned film portion 2, even if the region adjacent the edges of patterned film portion 2 is etched more than the region of the patterned film portion located inwardly of the edges of patterned film portion 2, substrate 4 is not etched, as shown FIG. 1(b).

Thereafter, the exposed resist 35 is washed away with a solvent to complete the intended removal processing by the ion beam etching without performing unnecessary or harmful processing of the substrate at the periphery of the edges of excess patterned film portion, or portions, 2, as shown in FIG. 1(c).

In this invention, as described above, the masking substance is provided only on the substrate surfaces not covered with patterned film portions during ion beam irradiation of the sample, and the removal processing by etching is performed in this stage, so that when the edges of the excess patterned film portions are processed, the removal processing by etching is performed without causing unnecessary or harmful processing of the substrate at the periphery of the edges of the excess patterned film portions.

This application relates to subject matter disclosed in Japanese Application number 4-78027, filed on Mar. 31, 1992, the disclosure of which is incorporated herein by reference.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and, not restrictive, the scope of the invention being indicated by the appended claims, rather than the foregoing description, and all changes which come within the meaning and range of equivalency of the claims are therefore intended to be embraced therein.

What is claimed:

1. A method for correcting a patterned film on a substrate surface by removing a defect constituted by an excess portion of the patterned film with a scanning focused ion beam, comprising, in the order recited, the steps of:

applying a negative type resist on the substrate surface and on the patterned film;

exposing the resist by irradiating the substrate, from the side of the substrate opposite to the substrate surface, with light which is substantially transmitted by the material of the substrate and is substantially blocked by the material of the patterned film;

removing only the resist which is on the patterned film;

irradiating the excess portion of the patterned film with the scanning focused ion beam for removing the excess portion of the patterned film from the substrate surface; and removing the exposed resist from the substrate surface by means of a solvent.

2. A method as claimed in claim 1 wherein the light employed in said exposing step is ultraviolet light.

3. A method as claimed in claim 1 for removing the excess portion of the patterned film from a photomask which constitutes the substrate.

4. A method as claimed in claim 1 for removing the excess portion of the patterned film from a reticle which constitutes the substrate.

* * * * *